(12) United States Patent
Zheng et al.

(10) Patent No.: US 11,728,821 B2
(45) Date of Patent: Aug. 15, 2023

(54) LSB DITHERING FOR SEGMENTED DACS

(71) Applicant: MediaTek Singapore Pte. Ltd., Singapore (SG)

(72) Inventors: Boyi Zheng, San Jose, CA (US); Nathan Egan, San Jose, CA (US); Stacy Ho, Reading, MA (US); Gerhard Mitteregger, San Jose, CA (US)

(73) Assignee: MEDIATEK Singapore Pte. Ltd., Republic of (SG)

( * ) Notice: Subject to any disclaimer, the term of this patent is extended or adjusted under 35 U.S.C. 154(b) by 0 days.

(21) Appl. No.: 17/530,357

(22) Filed: Nov. 18, 2021

(65) Prior Publication Data

US 2022/0271771 A1 Aug. 25, 2022

Related U.S. Application Data

(60) Provisional application No. 63/200,209, filed on Feb. 22, 2021.

(51) Int. Cl.
*H03M 1/00* (2006.01)
*H03M 1/68* (2006.01)

(52) U.S. Cl.
CPC ..................................... *H03M 1/68* (2013.01)

(58) Field of Classification Search
CPC .................................. H03M 1/68; H03M 1/66
USPC .......................................... 341/144, 131, 159
See application file for complete search history.

(56) References Cited

U.S. PATENT DOCUMENTS

| | | | |
|---|---|---|---|
| 4,857,927 A | 8/1989 | Takabayashi | |
| 4,916,449 A * | 4/1990 | Kubo | H03M 1/0641 |
| | | | 341/131 |
| 4,937,576 A | 6/1990 | Yoshio et al. | |
| 5,012,242 A | 4/1991 | Yoshio et al. | |
| 9,787,316 B2 | 10/2017 | Shu | |
| 10,069,505 B1 * | 9/2018 | Poulton | H03M 1/0641 |
| 10,666,285 B1 * | 5/2020 | Mehdizad Taleie | |
| | | | H03M 1/0626 |
| 2009/0002212 A1 | 1/2009 | De Ceuninck | |
| 2023/0046863 A1 * | 2/2023 | Dayel | G02F 1/2255 |

* cited by examiner

*Primary Examiner* — Peguy Jean Pierre
(74) *Attorney, Agent, or Firm* — Wolf, Greenfield & Sacks, P.C.

(57) ABSTRACT

A digital to analog (DAC) circuit that performs least significant bit (LSB) dithering comprises: a first DAC; an auxiliary code generator configured to produce an auxiliary code; an auxiliary DAC configured to receive the auxiliary code and convert the auxiliary code into an analog version of the auxiliary code; and summing circuitry to dither LSBs of the first DAC with the auxiliary code. The auxiliary code generator is configured to update the auxiliary code at a rate less than a sampling rate of the DAC circuit, the auxiliary code has a smaller range than that of a range of binary-weighted LSBs of the main DAC and/or the auxiliary code generator is configured to produce the auxiliary code as a predetermined repeating sequence.

20 Claims, 1 Drawing Sheet

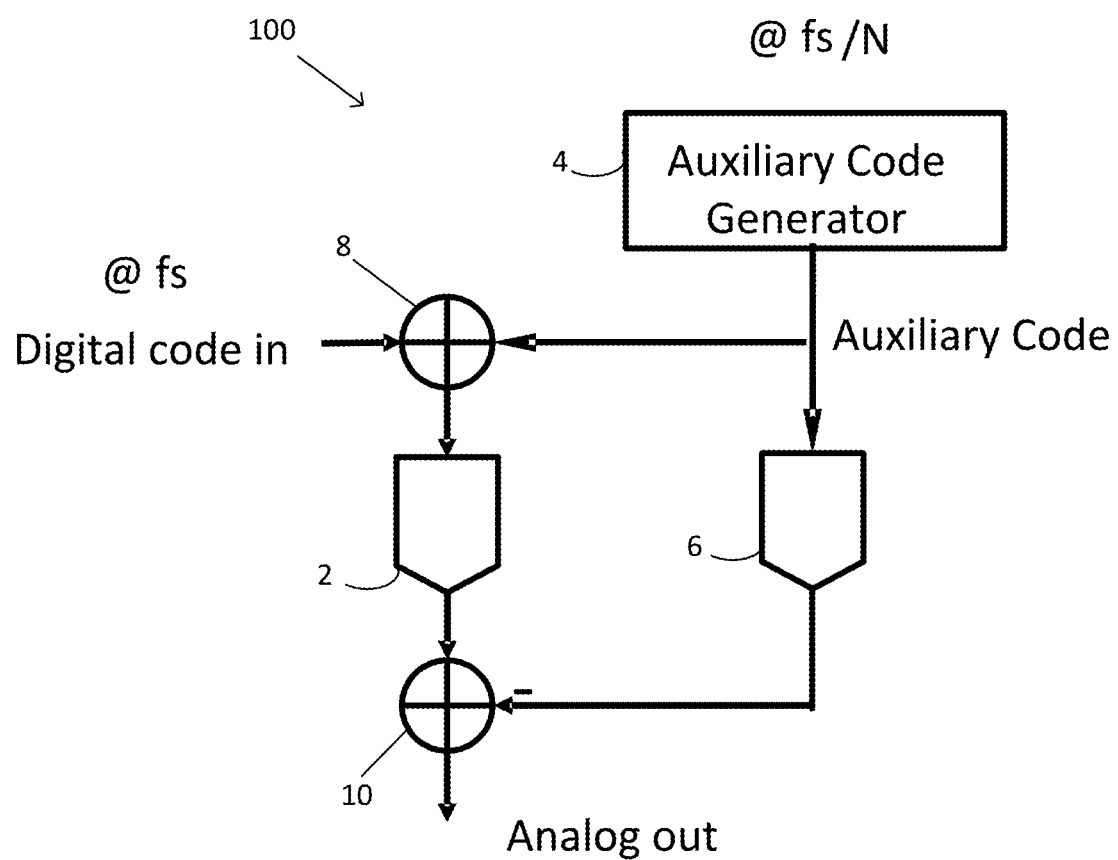

LSB DITHERING FOR SEGMENTED DACS

CROSS-REFERENCE TO RELATED APPLICATIONS

This application claims priority to U.S. Provisional Application Ser. No. 63/200,209, filed Feb. 22, 2021, and entitled "LEAST SIGNIFICANT BIT DITHERING METHOD FOR SEGMENTED DIGITAL-TO-ANALOG CONVERTER UTILIZING NON-RANDOM PATTERNS MINIMIZING SIGNAL-TO-NOISE RATIO DEGRADATION," which is hereby incorporated by reference in its entirety.

BACKGROUND

1. Technical Field

The techniques described herein relate to dithering of the least significant bits (LSBs) of a segmented digital to analog converter (DAC).

2. Discussion of the Related Art

DACs convert digital signals into analog signals, and are used in a variety of applications. Each bit may be encoded with a "weight" that identifies the magnitude of an analog signal that will be contributed to the output of the DAC by the corresponding current source of the DAC that is activated by the bit when the bit is high. Bits can be weighted using thermometer encoding, where each bit has the same weight, or binary encoding, in which the bits are weighted in a binary manner (i.e., each bit is a power of two of another bit).

SUMMARY

A digital to analog (DAC) circuit comprises: a main DAC; an auxiliary code generator configured to produce an auxiliary code; an auxiliary DAC configured to receive the auxiliary code and convert the auxiliary code into an analog version of the auxiliary code; first summing circuitry configured to sum an input digital code and the auxiliary code, and to provide the sum of the input digital code and the auxiliary code to the main DAC; and second summing circuitry configured to subtract the analog version of the auxiliary code from an analog signal output from the main DAC, wherein the auxiliary code generator is configured to update the auxiliary code at a rate less than a sampling rate of the DAC circuit, the auxiliary code has a smaller range than that of a range of binary-weighted LSBs of the main DAC and/or the auxiliary code generator is configured to produce the auxiliary code as a predetermined repeating sequence.

A digital to analog (DAC) circuit that performs least significant bit (LSB) dithering comprises: a first DAC; an auxiliary code generator configured to produce an auxiliary code; an auxiliary DAC configured to receive the auxiliary code and convert the auxiliary code into an analog version of the auxiliary code; and summing circuitry to dither LSBs of the first DAC with the auxiliary code, wherein the auxiliary code generator is configured to update the auxiliary code at a rate less than a sampling rate of the DAC circuit, the auxiliary code has a smaller range than that of a range of binary-weighted LSBs of the main DAC and/or the auxiliary code generator is configured to produce the auxiliary code as a predetermined repeating sequence.

The foregoing summary is provided by way of illustration and is not intended to be limiting.

BRIEF DESCRIPTION OF DRAWINGS

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the techniques and devices described herein.

FIG. 1 shows an example of a DAC circuit that performs LSB dithering, according to some embodiments.

DETAILED DESCRIPTION

The techniques described herein relate to dithering the binary-weighted LSB s of a DAC. The DAC may be segmented such that one or more MSBs may have a thermometer weighting scheme or another weighting scheme different from that of the LSBs. Dithering the LSBs may have the benefit of reducing alternating current (AC) distortion of the converted signal.

Some embodiments of the present application relate to a radio frequency (RF) DAC for wireless communication. For example, an RF DAC may be used for communication in accordance with WiFi 6, also known as IEEE Standard 802.11ax. Such a DAC may digitize the analog signals received through wireless communication. In WiFi 6, the signal may be bandlimited, but the sampling frequency $f_s$ may be more than 8 GS/s, which can increase power consumption. Power can be reduced by using one or more of the following techniques.

In some embodiments, the dither signal may be generated without a random number generator, which may reduce power consumption. For example, the dither signal may be a predetermined repeating sequence generated by a counter or other circuitry that has low power consumption. However, other embodiments may use a random number generator to generate the dither signal, as not all embodiments omit a random number generator.

In some embodiments, the dithering may be performed at a rate that is less than full rate (e.g., less than the sampling frequency $f_s$). Instead, the dithering may be performed at a rate of $f_s/N$, where N is an integer greater than or equal to two. Dithering at a rate less than full rate may reduce power consumption.

In some embodiments, the dithering may be performed at less than the full range of the binary-weighted LSBs. For example, if the LSBs are encoded with a range of values, the dithering signal may be a code within a range that is smaller than the range of the LSBs. Using a smaller range for the dithering allows for reducing the amount of hardware needed for the auxiliary DAC that processes the dither signal, which can reduce power consumption.

FIG. 1 shows an example of a DAC circuit 100 configured to perform LSB dithering, according to some embodiments. The DAC circuit 100 includes a main DAC 2 to convert an input digital code into an analog value. The main DAC 2 may be a segmented DAC with different weighting schemes for different bit segments. For example, the LSBs may be binary weighted and the MSBs may be thermometer weighted. However, the techniques and apparatus described herein are not limited to the weighting scheme for the MSBs. The DAC circuit 100 also includes an auxiliary code generator 4 that generates an auxiliary code, which is the dither signal. The auxiliary code generator 4 may be implemented in any number of ways, such as using a counter or another circuit configured to produce a repeating sequence of digital codes. The sequence may be determined in advance of operating the auxiliary code generator 4, as opposed to a random number generator in which the sequence is not known in advance. The sequence may include each number in the range of the auxiliary code. For example, if the auxiliary code has a range of zero to five, the sequence may include each integer between zero and five, inclusive. The sequence may count up (e.g., 0, 1, 2, 3, 4, 5, 0, 1, 2, 3, 4, 5, etc.) or down (e.g., 5, 4, 3, 2, 1, 0, 5, 4, 3, 2, 1, 0, etc.), or may have a more complex pattern. Advantageously, a counter or other circuit configured to produce a predetermined repeating sequence may have lower power consumption than a random number generator. However, the techniques and apparatus described herein are not limited in this respect, as in some embodiments the auxiliary code generator 4 may be implemented by a random number generator.

The DAC circuit 100 also includes an auxiliary DAC 6 configured to convert the auxiliary code into an analog signal. In operation, the auxiliary code is added to the input digital code by summing circuitry (e.g., an adder 8), so that the digital signal provided to the main DAC 2 is the sum of the digital code and the auxiliary code. The auxiliary DAC 6 receives the auxiliary code and converts the auxiliary code into an analog signal. The summing circuitry (e.g., adder 10) subtracts the analog signal version of the auxiliary code received from the auxiliary DAC 6 from the analog signal produced by the main DAC 2, so that the analog out signal is an analog version of the digital code. Alternatively, the polarity may be reversed such that the adder 8 subtracts the auxiliary code from the digital code and the adder 10 adds the analog version of the auxiliary code to the output of the main DAC 6. The adders 8 and 10 may be implemented by any circuitry capable of summing signals in the digital or analog domain, respectively, and may perform addition and/or subtraction, as it is understood in the art that adders may perform addition or subtraction, and are not limited to performing addition. In some embodiments, the use of LSB dithering may improve AC distortion.

As mentioned above, in some embodiments the auxiliary code generator 4 may operate at less than full rate, which may reduce power consumption. For example, in some embodiments the auxiliary code generator may update the auxiliary code at a rate of $F_s/N$, where $F_s$ is a sampling frequency of the DAC circuit 100 and N is a positive integer greater than or equal to two.

Alternatively or additionally, in some embodiments the auxiliary code generator 4 may produce an auxiliary code in a range that is smaller than the full range of the LSBs. The inventors have appreciated an auxiliary code of reduced range is effective to reduce AC distortion while reducing power consumption. The full range of the LSBs is from zero to the sum of the weights of the LSBs that are binary-weighted. For example, if there are four binary-weighted LSBs, the full range of the binary-weighted LSBs is zero to fifteen, and the auxiliary code may have a range that is narrower than zero to fifteen. As an example, if there are four binary-weighted LSBs the auxiliary code may have three bits, which has a range of zero to seven. Accordingly, the auxiliary DAC 6 may have less hardware because there are fewer bits to convert, which may reduce power consumption. However, this is an example, and the auxiliary code may have any range smaller than that of the binary-weighted LSBs and/or fewer bits than that of the binary-weighted LSBs. In some embodiments, the range of the auxiliary code may be greater than 5%, greater than 10% greater than 20% and less than 99.9%, less than 95%, or less than 80% of the full range of the binary-weighted LSBs.

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A digital to analog (DAC) circuit, comprising:
   a main DAC;
   an auxiliary code generator configured to produce an auxiliary code;
   an auxiliary DAC configured to receive the auxiliary code and convert the auxiliary code into an analog version of the auxiliary code;
   first summing circuitry configured to sum an input digital code and the auxiliary code, and to provide the sum of the input digital code and the auxiliary code to the main DAC; and
   second summing circuitry configured to subtract the analog version of the auxiliary code from an analog signal output from the main DAC,
   wherein the auxiliary code generator is configured to update the auxiliary code at a rate less than a sampling rate of the DAC circuit, the auxiliary code has a smaller range than that of a range of binary-weighted LSBs of the main DAC and/or the auxiliary code generator is configured to produce the auxiliary code as a predetermined repeating sequence.

2. The DAC circuit of claim 1, wherein the auxiliary code generator is configured to update the auxiliary code at a rate less than a sampling rate of the DAC circuit.

3. The DAC circuit of claim 2, wherein the auxiliary code generator is configured to update the auxiliary code at a rate that is a sampling rate of the DAC circuit divided by N, where N is an integer greater than or equal to two.

4. The DAC circuit of claim 1, wherein the auxiliary code has a smaller range than that of a range of binary-weighted LSBs of the main DAC.

5. The DAC circuit of claim 4, wherein the auxiliary code has a smaller number of bits than the number of binary-weighted LSBs of the main DAC.

6. The DAC circuit of claim 5, wherein the auxiliary DAC is configured to convert a smaller number of bits than the number of binary-weighted LSBs of the main DAC.

7. The DAC circuit of claim 1, wherein the auxiliary code generator is configured to produce the auxiliary code as a predetermined repeating sequence.

8. The DAC circuit of claim 7, wherein the auxiliary code generator comprises a counter.

9. The DAC circuit of claim 1, configured to perform two or more of:
  i) the auxiliary code generator is configured to update the auxiliary code at a rate less than a sampling rate of the DAC circuit;
  ii) the auxiliary code has a smaller range than that of a range of binary-weighted LSBs of the main DAC; and/or
  iii) the auxiliary code generator is configured to produce the auxiliary code as a predetermined repeating sequence.

10. The DAC circuit of claim 1, wherein the auxiliary code generator is configured to update the auxiliary code at a rate less than a sampling rate of the DAC circuit, the auxiliary code has a smaller range than that of a range of binary-weighted LSBs of the main DAC and the auxiliary code generator is configured to produce the auxiliary code as a predetermined repeating sequence.

11. A digital to analog (DAC) circuit that performs least significant bit (LSB) dithering, the DAC circuit comprising:
  a main DAC;
  an auxiliary code generator configured to produce an auxiliary code;
  an auxiliary DAC configured to receive the auxiliary code and convert the auxiliary code into an analog version of the auxiliary code; and
  summing circuitry to dither LSBs of the main DAC with the auxiliary code,
  wherein the auxiliary code generator is configured to update the auxiliary code at a rate less than a sampling rate of the DAC circuit, the auxiliary code has a smaller range than that of a range of binary-weighted LSBs of the main DAC and/or the auxiliary code generator is configured to produce the auxiliary code as a predetermined repeating sequence.

12. The DAC circuit of claim 11, wherein the auxiliary code generator is configured to update the auxiliary code at a rate less than a sampling rate of the DAC circuit.

13. The DAC circuit of claim 12, wherein the auxiliary code generator is configured to update the auxiliary code at a rate that is a sampling rate of the DAC circuit divided by N, where N is an integer greater than or equal to two.

14. The DAC circuit of claim 11, wherein the auxiliary code has a smaller range than that of a range of binary-weighted LSBs of the main DAC.

15. The DAC circuit of claim 14, wherein the auxiliary code has a smaller number of bits than the number of binary-weighted LSBs of the main DAC.

16. The DAC circuit of claim 15, wherein the auxiliary DAC is configured to convert a smaller number of bits than the number of binary-weighted LSBs of the main DAC.

17. The DAC circuit of claim 11, wherein the auxiliary code generator is configured to produce the auxiliary code as a predetermined repeating sequence.

18. The DAC circuit of claim 17, wherein the auxiliary code generator comprises a counter.

19. The DAC circuit of claim 11, configured to perform two or more of:
  i) the auxiliary code generator is configured to update the auxiliary code at a rate less than a sampling rate of the DAC circuit;
  ii) the auxiliary code has a smaller range than that of a range of binary-weighted LSBs of the main DAC; and/or
  iii) the auxiliary code generator is configured to produce the auxiliary code as a predetermined repeating sequence.

20. The DAC circuit of claim 11, wherein the auxiliary code generator is configured to update the auxiliary code at a rate less than a sampling rate of the DAC circuit, the auxiliary code has a smaller range than that of a range of binary-weighted LSBs of the main DAC and the auxiliary code generator is configured to produce the auxiliary code as a predetermined repeating sequence.

* * * * *